(12) United States Patent
Park

(10) Patent No.: US 11,792,946 B2
(45) Date of Patent: Oct. 17, 2023

(54) DISPLAY DEVICE HAVING A FOLDING AREA

(71) Applicant: Samsung Display Co., Ltd., Yongin-si (KR)

(72) Inventor: Changmin Park, Gwangmyeong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 158 days.

(21) Appl. No.: 17/125,868

(22) Filed: Dec. 17, 2020

(65) Prior Publication Data

US 2021/0352812 A1    Nov. 11, 2021

(30) Foreign Application Priority Data

May 7, 2020    (KR) .......................... 10-2020-0054625

(51) Int. Cl.
*H05K 5/02*    (2006.01)
*H05K 5/00*    (2006.01)
*H10K 50/84*    (2023.01)
*H10K 102/00*    (2023.01)

(52) U.S. Cl.
CPC ......... *H05K 5/0226* (2013.01); *H05K 5/0017* (2013.01); *H10K 50/84* (2023.02); *H10K 2102/311* (2023.02)

(58) Field of Classification Search
CPC .... G06F 1/1681; G06F 1/1652; H05K 5/0226
See application file for complete search history.

(56) References Cited

U.S. PATENT DOCUMENTS

| | | | |
|---|---|---|---|
| 9,348,450 B1* | 5/2016 | Kim | G06F 1/1616 |
| 9,557,771 B2* | 1/2017 | Park | H04M 1/022 |
| 9,791,892 B2 | 10/2017 | Park et al. | |
| 10,015,897 B1* | 7/2018 | Hong | H04M 1/0268 |
| 10,082,839 B1* | 9/2018 | Turchin | H05K 5/0017 |
| 10,120,421 B1* | 11/2018 | Hong | G06F 1/1681 |
| 10,365,691 B2* | 7/2019 | Bae | G06F 1/1652 |

(Continued)

FOREIGN PATENT DOCUMENTS

| | | |
|---|---|---|
| KR | 10-2016-0083608 | 7/2016 |
| KR | 10-1776262 | 9/2017 |

(Continued)

*Primary Examiner* — Rockshana D Chowdhury
*Assistant Examiner* — Douglas R Burtner
(74) *Attorney, Agent, or Firm* — H.C. Park & Associates, PLC

(57) ABSTRACT

A display device including a display panel having a first non-folding area, a second non-folding area, a folding area therebetween, and a first bending area and a second bending area between the folding area and respective non-folding areas, a plate disposed below the display panel, and a folding module disposed below the plate to support the display pane and including a hinge configured to support the folding area, a first support configured to support the first non-folding area and coupled to the hinge, a second support configured to support the second non-folding area and coupled to the hinge, a first sub support configured to support the first bending area and rotatably coupled to the first support, and a second sub support configured to support the second bending area and rotatably coupled to the second support.

20 Claims, 12 Drawing Sheets

(56) References Cited

U.S. PATENT DOCUMENTS

| | | | |
|---|---|---|---|
| 10,423,019 B1 | 9/2019 | Song | |
| 10,485,116 B2* | 11/2019 | Kim | G06F 1/1641 |
| 10,495,941 B2 | 12/2019 | Hashimoto et al. | |
| 10,520,989 B1* | 12/2019 | Hsu | G06F 1/1616 |
| 10,520,992 B1* | 12/2019 | Chang | H05K 5/0226 |
| 10,564,682 B1* | 2/2020 | Wu | H05K 5/0226 |
| 10,831,243 B2* | 11/2020 | Kim | G06F 1/1652 |
| 10,993,338 B2* | 4/2021 | Cha | H05K 5/0226 |
| 11,243,578 B2* | 2/2022 | Torres | G06F 1/1616 |
| 11,294,431 B2* | 4/2022 | Torres | G06F 1/1681 |
| 11,372,453 B2* | 6/2022 | Yu | G06F 9/30 |
| 11,516,323 B2* | 11/2022 | Jung | G06F 1/1681 |
| 11,550,367 B2* | 1/2023 | Lin | G06F 1/1681 |
| 11,609,606 B2* | 3/2023 | Myeong | G06F 1/1681 |
| 11,615,722 B2* | 3/2023 | Morino | G06F 1/1616 |
| | | | 345/173 |
| 11,653,520 B2* | 5/2023 | Sim | H04M 1/022 |
| | | | 361/679.01 |
| 2013/0021762 A1* | 1/2013 | van Dijk | G09F 9/301 |
| | | | 361/749 |
| 2015/0089974 A1* | 4/2015 | Seo | A44C 5/0076 |
| | | | 63/1.13 |
| 2016/0014919 A1* | 1/2016 | Huitema | G04G 17/08 |
| | | | 313/511 |
| 2016/0295709 A1* | 10/2016 | Ahn | G06F 1/1652 |
| 2016/0302314 A1* | 10/2016 | Bae | G06F 1/16 |
| 2017/0359915 A1* | 12/2017 | Yang | H05K 5/0017 |
| 2017/0374749 A1* | 12/2017 | Lee | H05K 5/0017 |
| 2018/0213663 A1* | 7/2018 | Lin | F16C 11/04 |
| 2019/0036068 A1* | 1/2019 | Kim | G06F 1/1601 |
| 2019/0082544 A1* | 3/2019 | Park | H05K 5/0226 |
| 2019/0166703 A1* | 5/2019 | Kim | G06F 1/1681 |
| 2020/0081486 A1* | 3/2020 | Lin | H04M 1/022 |
| 2020/0137907 A1* | 4/2020 | Kang | H05K 5/0017 |
| 2020/0233466 A1* | 7/2020 | Sanchez | H05K 5/0017 |
| 2020/0253069 A1* | 8/2020 | Cha | G06F 1/1681 |
| 2020/0352044 A1* | 11/2020 | Hsu | H05K 5/0247 |
| 2021/0011514 A1* | 1/2021 | Wang | G06F 1/1681 |
| 2021/0132662 A1* | 5/2021 | Cavallaro | G06F 1/1643 |
| 2021/0243908 A1* | 8/2021 | Park | G06F 1/1652 |
| 2021/0307185 A1* | 9/2021 | Hong | H05K 5/0226 |
| 2021/0307186 A1* | 9/2021 | Hong | H04M 1/0216 |
| 2022/0303371 A1* | 9/2022 | Liao | H04M 1/0268 |
| 2023/0075646 A1* | 3/2023 | Niu | H04M 1/0268 |

FOREIGN PATENT DOCUMENTS

| | | |
|---|---|---|
| KR | 10-2019-0065912 | 6/2019 |
| KR | 10-2019-0124110 | 11/2019 |
| KR | 10-2085235 | 3/2020 |

* cited by examiner

DISPLAY DEVICE HAVING A FOLDING AREA

CROSS-REFERENCE TO RELATED APPLICATION

This application claims priority from and the benefit of Korean Patent Application No. 10-2020-0054625, filed on May 7, 2020, which is hereby incorporated by reference for all purposes as if fully set forth herein.

BACKGROUND

Field

Embodiments of the invention relate generally to a foldable display device.

Discussion of the Background

In general, electronic equipment for providing an image to a user, such as smart phones, digital cameras, laptop computers, navigation systems, smart televisions, and the like, include display devices for displaying an image. The display device generates an image to provide the image to the user through a display screen.

In recent years, various types of display devices have been developed with the development of technology of display devices. For example, various flexible display devices that may be deformed into a curved shape, folded, or rolled are being developed. The flexible display device may be easily carried and improve user's convenience.

Among the flexible display devices, a foldable display device can be folded with respect to a folding axis extending in one direction. However, several unpredicted issues have been discovered in the foldable display device, such as deformation of a folding area and damaging elements therein.

The above information disclosed in this Background section is only for understanding of the background of the inventive concepts, and, therefore, it may contain information that does not constitute prior art.

SUMMARY

Display devices constructed according to embodiments of the invention are capable of improving flatness.

Embodiments also provide a display device including a folding module having improved durability against an external impact.

Additional features of the inventive concepts will be set forth in the description which follows, and in part will be apparent from the description, or may be learned by practice of the inventive concepts.

A display device according to an embodiment includes a display panel including a first non-folding area, a second non-folding area spaced apart from the first non-folding area in a first direction, a folding area disposed between the first non-folding area and the second non-folding area, a first bending area disposed between the folding area and the first non-folding area, and a second bending area disposed between the folding area and the second non-folding area, a plate disposed below the display panel, and a folding module disposed below the plate to support the display panel, in which the folding module includes a hinge configured to support the folding area, a first support configured to support the first non-folding area and coupled to the hinge, a second support configured to support the second non-folding area and coupled to the hinge, a first sub support configured to support the first bending area and rotatably coupled to the first support to rotate, and a second sub support configured to support the second bending area and rotatably coupled to the second support.

When the display device is folded, a distance between the first non-folding area of the display panel and the second non-folding area of the display panel may be less than twice a curvature radius of the folding area.

The first sub support and the second sub support may contact the plate, and the first support and the second support may be coupled to the plate.

The hinge may include a body part extending in a second direction crossing the first direction, a plurality of first wing parts rotatably coupled to the body part, and a plurality of second wing parts rotatably coupled to the body part, and the first wing parts may be coupled to the first support, and the second wing parts may be coupled to the second support.

When the display device is folded, the first sub support and the second sub support may be spaced apart from the body part.

The display device may further include electronic modules, in which the body part may have an inner space in which the electronic modules may be disposed.

When the display device is folded, the body part may contact the plate.

The body part may have a top surface including a first plane, a second plane spaced apart from the first plane in the first direction, and a support groove that is concavely recessed between the first plane and the second plane.

The folding module may further include a first shaft coupled to the first support to pass through the first sub support, and a second shaft coupled to the second support to pass through the second sub support.

The folding module may further include a first spring disposed to pass through the first shaft and coupled to the first support and the first sub support, and a second spring disposed to pass through the second shaft and coupled to the second support and the second sub support.

The folding module may further include a first guide disposed below the first sub support and a second guide disposed below the second sub support, and a first accommodation hole formed in the first support to accommodate the first guide, and a second accommodation hole formed in the second support to accommodate the second guide.

When viewed in a plane, the first guide may protrude from the first sub support in a second direction crossing the first direction, and the second guide part may protrude from the second sub support in the second direction.

The plate may include a first plate disposed below the first bending area and the first non-folding area, and a second plate disposed below the second bending area and the second non-folding area and spaced apart from the first plate in the first direction.

The plate may be disposed below the first non-folding area, the second non-folding area, the folding area, the first bending area, and the second bending area and may have a continuous shape.

When viewed in a plane, the plate may include a plurality of grooves defined in a portion thereof that overlaps the folding area of the display panel.

When the display device is folded, the folding area may have a first curvature, and each of the first bending area and the second bending area may have a second curvature less than the first curvature in an opposite direction of the first curvature.

The first support may include a first lower support in which a first opening is defined, a first upper support disposed on the first lower support and slidably coupled to the first lower support, and a first elastic part disposed in the first opening.

A display device according to another embodiment includes a foldable or unfoldable display panel, a plate disposed below the display panel, a hinge disposed below the plate, a first support disposed below the plate and coupled to one side of the hinge, a second support disposed below the plate and coupled to the other side of the hinge, a first sub support disposed between the first support and the hinge, and a second sub support disposed between the second support and the hinge, in which, when the display panel is unfolded, a top surface of the hinge, a top surface of the first support, a top surface of the second support, a top surface of the first support, and a top surface of the second sub support provide a flat surface.

The plate may be coupled to the first support and the second support, and the plate may contact the hinge, the first sub support, and the second sub support.

When the display panel is folded, the hinge may be spaced apart from the first sub support and the second sub support.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
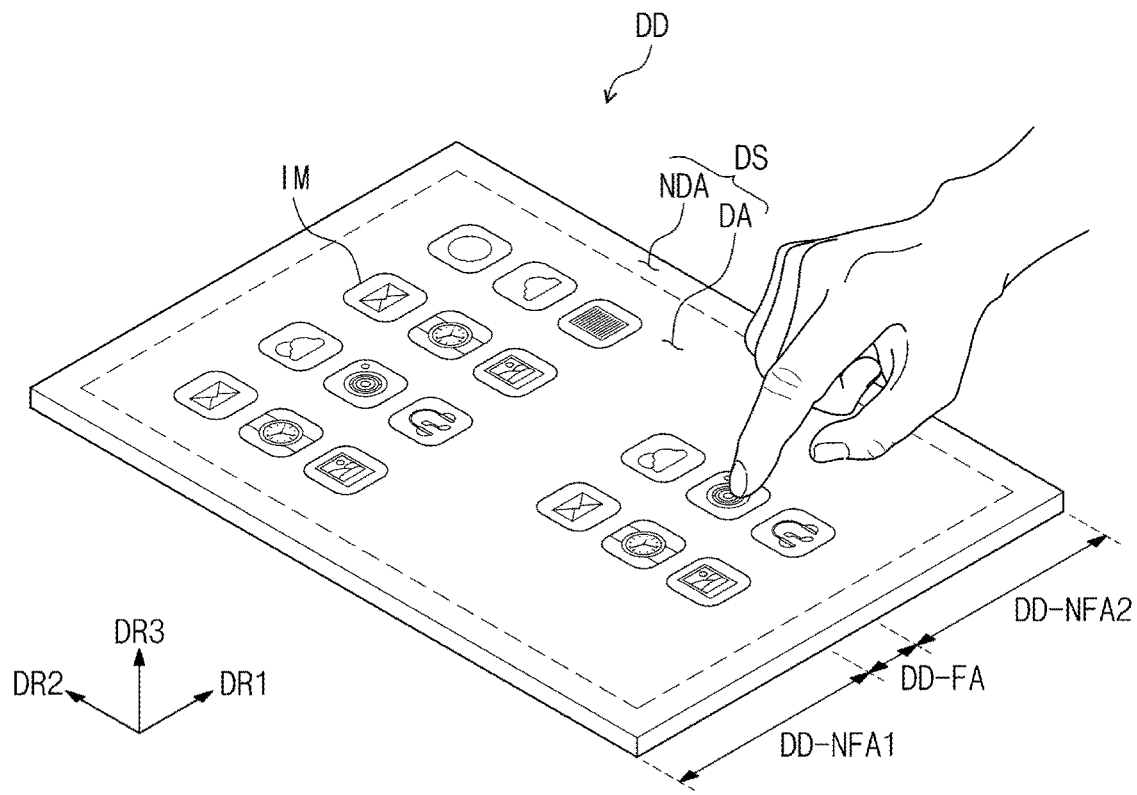
FIG. 1A is a perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
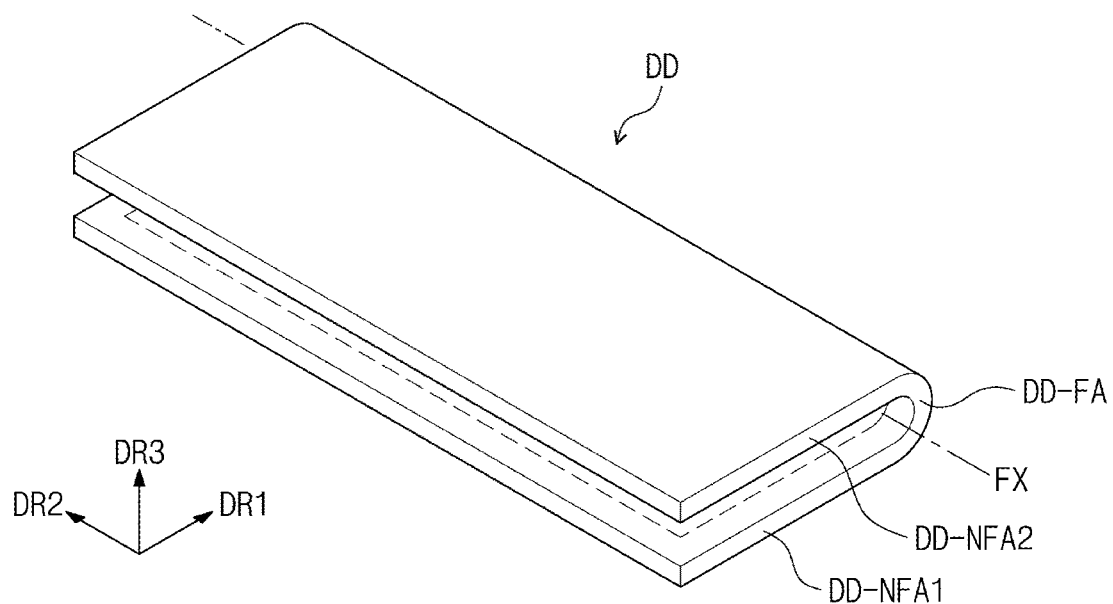
FIG. 1B is a view illustrating a folded state of the display device of FIG. 1A according to an embodiment.

FIG. 1A is a perspective view of a display device according to an embodiment, and FIG. 1B is a view illustrating a folded state of the display device of FIG. 1A according to an embodiment.

Referring to FIGS. 1A and 1B, a display device DD may be a device that is activated according to an electrical signal. For example, the display device DD may be a mobile phone, a tablet PC, a car navigation system, a game console, or a wearable device, without being limited thereto. The display device DD may be a flexible display device.

The display device DD may be parallel to a surface defined by a first direction DR1 and a second direction DR2 crossing the first direction DR1. A normal direction of the display device DD, e.g., a thickness direction of the display device DD, is indicated as a third direction DR3.

A front surface (or a top surface) and a rear surface (or a bottom surface) of each member or unit, which will be described below, may be distinguished from each other by the third direction DR3. The third direction DR3 may be a direction crossing the first direction DR1 and the second direction DR2. For example, the first direction DR1, the second direction DR2, and the third direction DR3 may cross each other. Also, as used herein, a surface defined by the first direction DR1 and the second direction DR2 may be defined as a plane, and "when viewed in a plane" may refer to a view in the third direction DR3.

The display device DD may include a folding area DD-FA and a plurality non-folding areas DD-NFA1 and DD-NFA2. The non-folding areas DD-NFA1 and DD-NFA2 may include a first non-folding area DD-NFA1 and a second non-folding area DD-NFA2. The folding area DD-FA may be disposed between the first non-folding area DD-NFA1 and the second non-folding area DD-NFA2. The folding area DD-FA, the first non-folding area DD-NFA1, and the second non-folding area DD-NFA2 may be arranged in the first direction DR1.

Although one folding area DD-FA and two non-folding areas DD-NFA1 and DD-NFA2 are exemplarily illustrated in FIGS. 1A and 1B, the inventive concepts are not limited to a particular number of folding area DD and non-folding areas DD-NFA1 and DD-NFA2. For example, the display device DD according to another embodiment may include more than two non-folding areas and more than two folding areas disposed between the two or more non-folding areas.

The top surface of the display device DD may be defined as a display surface DS. The display surface DS may have a plane defined by the first direction DR1 and the second direction DR2. Images IM generated from the display device DD may be provided to a user through the display surface DS.

The display surface DS may include a display area DA and a non-display area NDA adjacent to the display area DA. An image IM may be displayed on the display area DA but may not be displayed on the non-display area NDA. The non-display area NDA may surround the display area DA and define an edge of the display device DD, which may be printed with a predetermined color.

The display device DD may be a folding-type (foldable) display device DD that is capable of being folded or unfolded. The folding area DD-FA may be folded with respect to a folding axis FX extending in the second direction DR2 so that the display device DD may be folded. For example, the folding axis FX may be defined as a long axis parallel to a long side of the display device DD.

When the display device DD is folded, a first non-folding area DD-NFA1 and a second non-folding area DD-NFA2 may face each other. The display device DD may be in-folded so that a display surface DS is not exposed to the outside when folded.

Figure 2A:
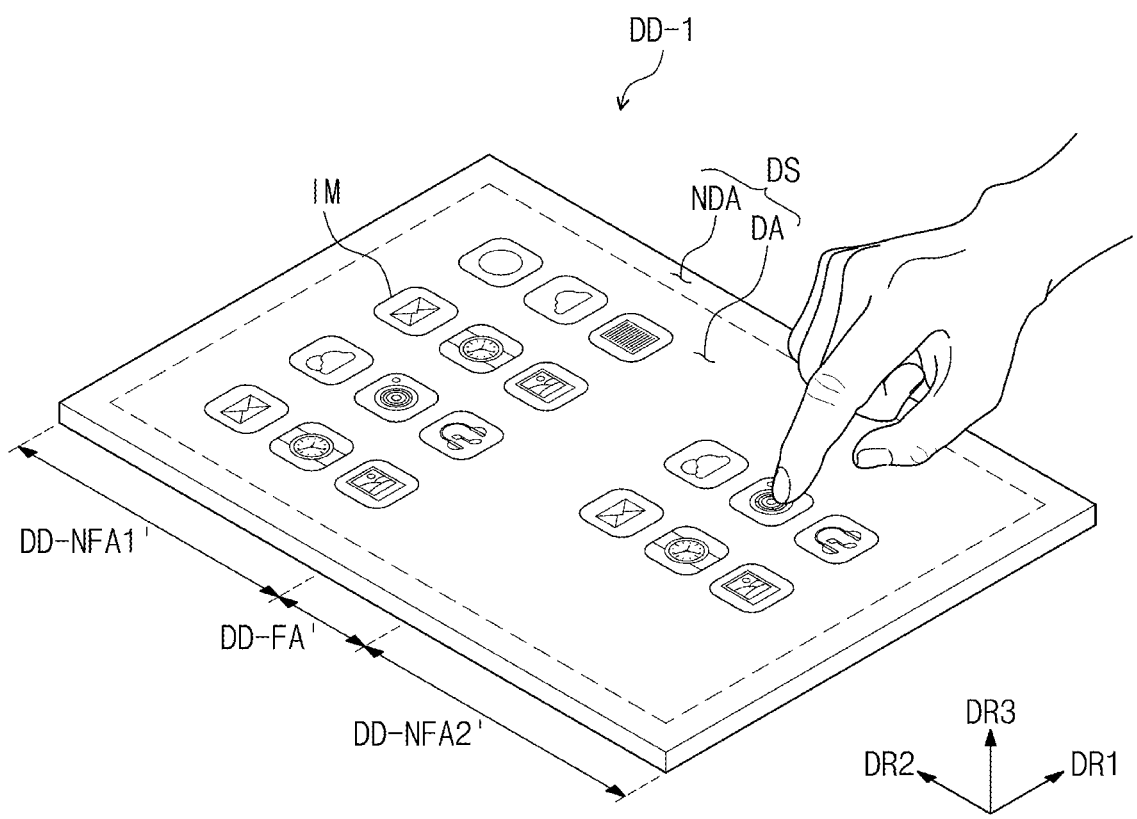
FIG. 2A is a perspective view of a display device according to an embodiment.
Figure 2B:
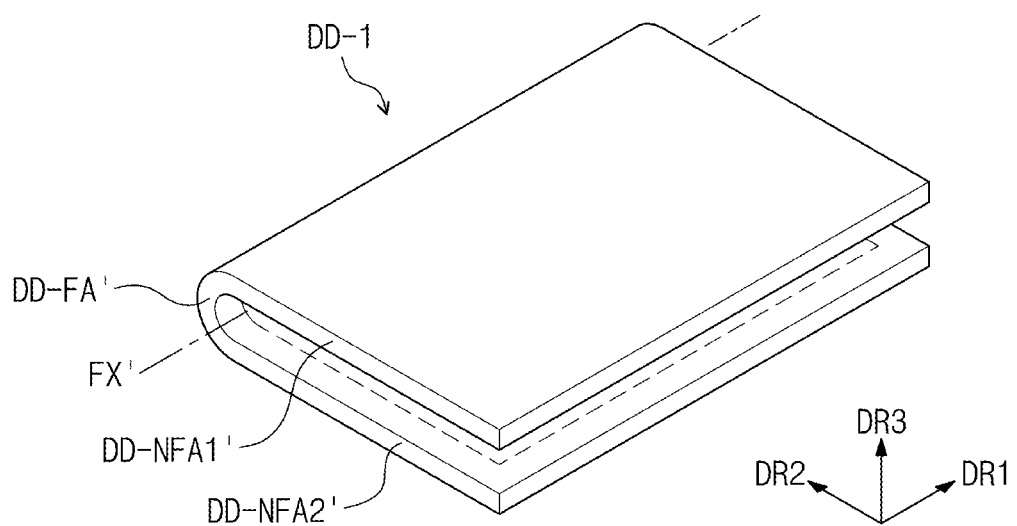
FIG. 2B is a view illustrating a folded state of the display device of FIG. 2A according to an embodiment.

FIG. 2A is a perspective view of a display device according to an embodiment, and FIG. 2B is a view illustrating a folded state of the display device of FIG. 2A according to an embodiment. Hereinafter, the components of the display device shown in FIGS. 2A and 2B that are substantially the same as those shown in FIGS. 1A and 1B will be given the same reference numerals, and repeated descriptions thereof will be omitted.

Referring to FIGS. 2A and 2B, a display device DD-1 may include a folding area DD-FA' and a plurality of non-folding areas DD-NFA1' and DD-NFA2'. The plurality of non-folding areas DD-NFA1' and DD-NFA2' may include a first non-folding area DD-NFA1' and a second non-folding area DD-NFA2'. The folding area DD-FA' may be disposed between the first non-folding area DD-NFA1' and the second non-folding area DD-NFA2'. The folding area DD-FA', the first non-folding area DD-NFA1', and the second non-folding area DD-NFA2' may be arranged in the second direction DR2.

The display device DD-1 may be a folding-type (foldable) display device DD-1 that is capable of being folded or unfolded. The folding area DD-FA' may be folded with respect to a folding axis FX' extending in the first direction DR1 so that the display device DD may be folded. For example, the folding axis FX' may be defined as a short axis parallel to a short side of the display device DD-1. When the display device DD-1 is folded, the first non-folding area DD-NFA1' and the second non-folding area DD-NFA2' may face each other. The display device DD-1 may be in-folded so that a display surface DS is not exposed to the outside when folded.

Hereinafter, a folded structure of the display device DD will exemplarily be described as being folded along the long axis, however, the inventive concepts are not limited thereto, and structures described later may be applied to the display device DD-1 that may be folded along the short axis.

Figure 3:
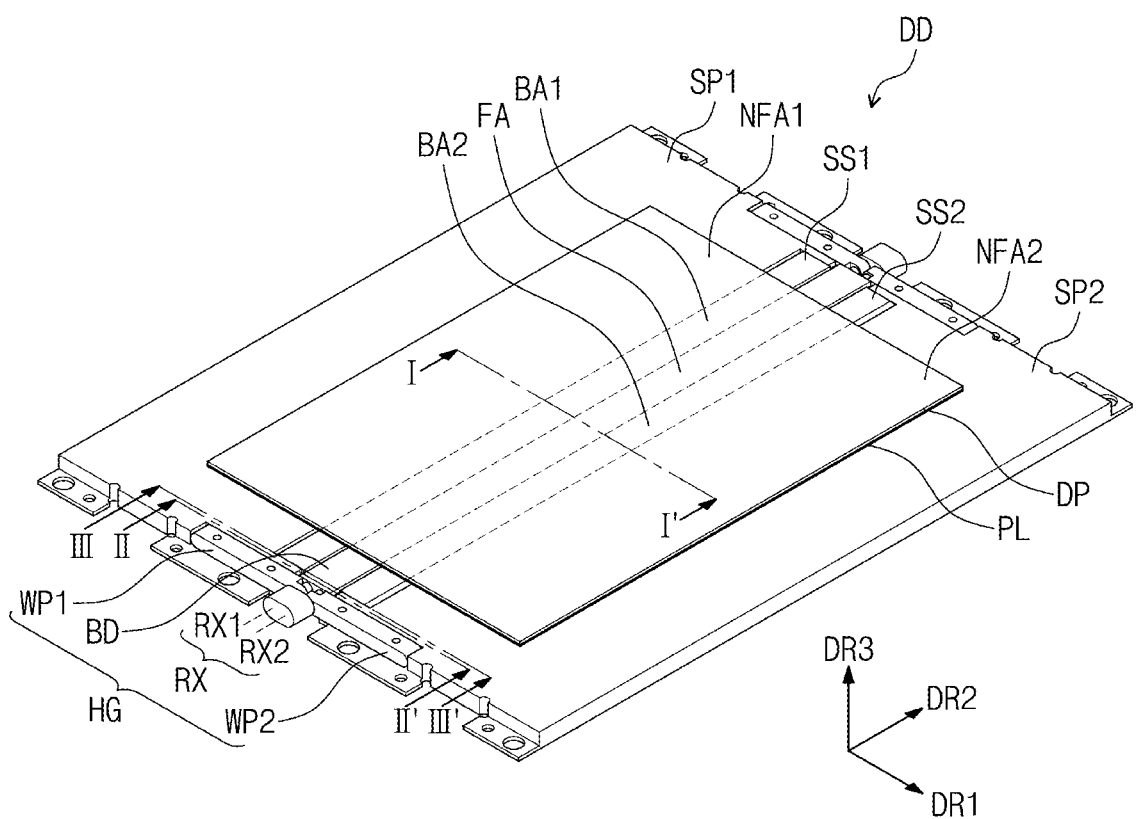
FIG. 3 is a perspective view of a display device according to an embodiment.
Figure 4:
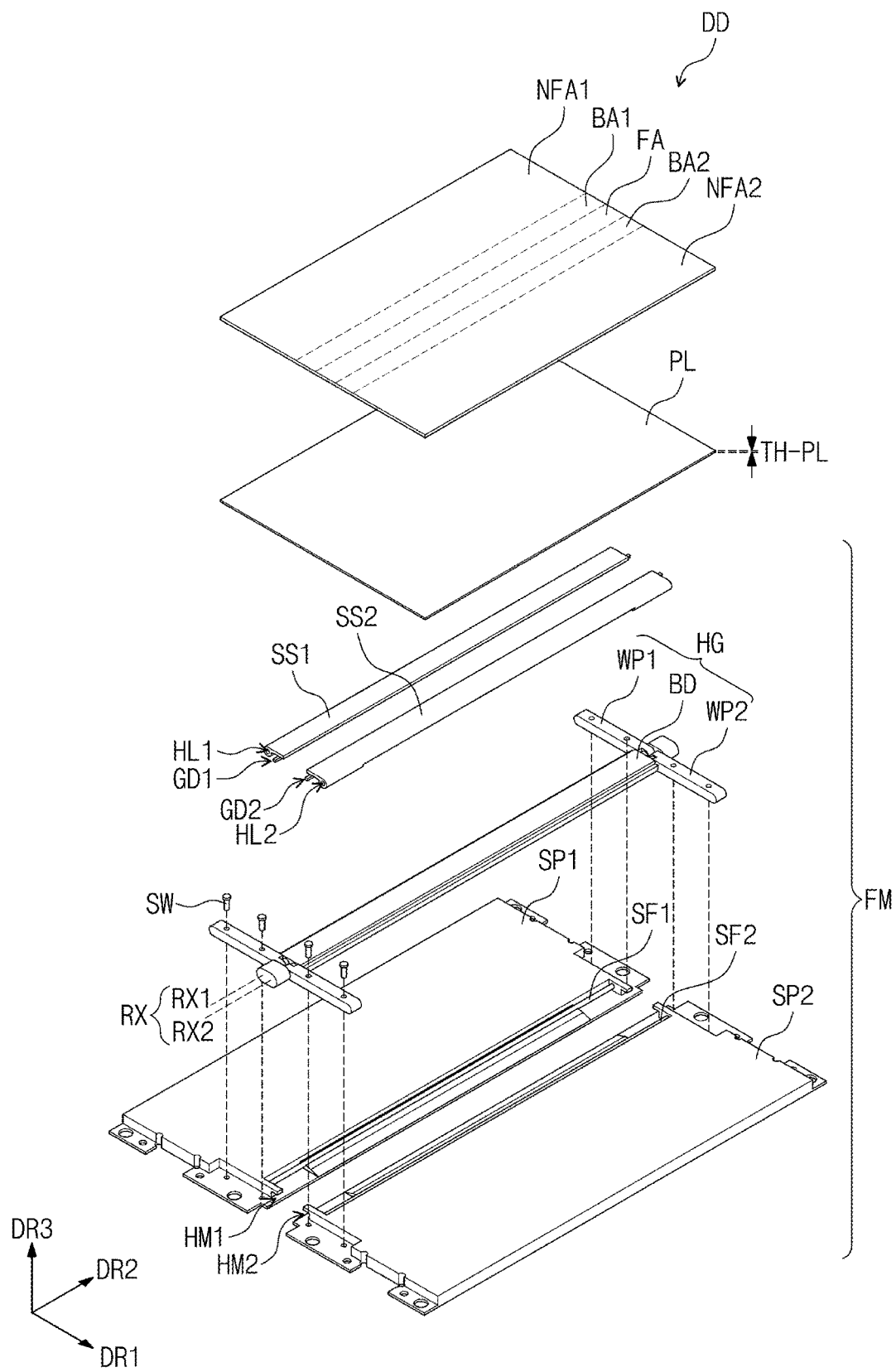
FIG. 4 is an exploded perspective view of the display device according to an embodiment.

FIG. 3 is a perspective view of a display device according to an embodiment, and FIG. 4 is an exploded perspective view of the display device according to an embodiment.

Referring to FIGS. 3 and 4, a display device DD may include a display panel DP, a plate PL, and a folding module FM.

The display panel DP may substantially generate an image IM. The display panel 100 may be an emissive display panel, without being limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include quantum dots and/or quantum rods.

The display panel DM may include a first non-folding area NFA1, a second non-folding area NFA2, a folding area FA, a first bending area BA1, and a second bending area BA2. The second non-folding area NFA2 and the first non-folding area NFA1 may be spaced apart from each other in a first direction DR1. The folding area FA may be disposed between the first non-folding area NFA1 and the second non-folding area NFA2. The first bending area BA1 may be disposed between the folding area FA and the first non-folding area NFA1. The second bending area BA2 may be disposed between the folding area FA and the second folding area NFA2.

The folding area FA, the first bending area BA1, and the second bending area BA2 may correspond to the folding area DD-FA of the display device DD (see FIG. 1A). The first non-folding area NFA1 may correspond to the first non-folding area DD-NFA1 of the display device DD (see FIG. 1A). The second non-folding area NFA2 may correspond to the second non-folding area DD-NFA2 of the display device DD (see FIG. 1A).

The plate PL may be disposed below the display panel DP. The plate PL may support the display panel DP. The plate PL may be attached to the display panel DP. For example, the plate PL may be attached to a rear surface of the display panel DP, which is a surface opposite to a front surface of the display panel DP. The front surface of the display panel DP may be a surface on which the image IM is displayed.

The plate PL may include metal, without being limited thereto. For example, the plate PL may be made of stainless steel (SUS). As another example, the plate PL may be a titanium (Ti) alloy or Invar®. The plate PL may have a thickness TH-PL of about 0.05 mm to about 0.2 mm. However, the inventive concepts are not limited thereto, and the thickness TH-PL of the plate PL may be variously changed as long as the plate PL is foldable.

According to an embodiment, the plate PL may be foldable or unfoldable along the display panel DP. The plate PL may support the folded or unfolded display panel DP to improve flatness of the display panel DP. The folding area FA of the display panel DP may be supported by the plate PL to maintain its flatness. In this manner, the shape of the folding area FA of the display panel DP may be suppressed from being deformed in the unfolded state.

The folding module FM may be disposed below the plate PL. The folding module FM may support the folded or unfolded display panel DP and the plate PL. The folding module FM may include a hinge HG, a first support SP1, a second support SP2, a first shaft SF1, a second shaft SF2, a first sub support SS1, a second sub support SS2, a first guide GD1, and a second guide GD2.

The hinge HG may support the folding area FA of the display panel DP. The hinge HG may provide a rotation axis RX to the first support SP1 and the second support SP2. The hinge HG may allow the first support SP1 and the second support SP2 to rotate about the rotation axis RX. The display panel DP and the plate PL may be folded according to the rotation of the first support SP1 and the second support SP2.

The rotation axis RX may include a plurality of rotation axes. For example, the rotation axis RX may be a two-axis rotation axis. The rotation axis RX may include a first rotation axis RX1 and a second rotation axis RX2. The first rotation axis RX1 may extend in the second direction DR2. The second rotation axis RX2 may extend in the second direction DR2 and may be spaced apart from the first rotation axis RX1 in the first direction DR1. The first support SP1 and the second support SP2 may rotate about the rotation axis RX.

The hinge HG may include a body part BD, a plurality of first wing parts WP1, and a plurality of second wing parts WP2.

The body part BD may extend in the second direction DR2. When viewed in a plane, the body part BD may overlap the folding area FA of the display panel DP. The body part BD may support the folding area FA of the display panel DP.

Each of the plurality of first wing parts WP1 may extend in the first direction DR1. The plurality of first wing parts WP1 may be disposed to be spaced apart from each other in the second direction DR2 with the body part BD therebetween. The plurality of first wing parts WP1 may be rotatably coupled to the body part BD. The plurality of first wing parts WP1 may rotate about the first rotation axis RX1. The plurality of first wing parts WP1 may be coupled to the first support SP1. For example, the first support SP1 and the plurality of first wing parts WP1 may be coupled by at least one screw SW.

Each of the plurality of second wing parts WP2 may extend in the first direction DR1. The plurality of second wing parts WP2 may be disposed to be spaced apart from each other in the second direction DR2 with the body part BD therebetween. Each of the plurality of first wing parts WP1 and each of the plurality of second wing parts WP2 may be arranged in the first direction DR1. The plurality of second wing parts WP2 may be rotatably coupled to the body part BD. The plurality of second wing parts WP2 may rotate about the second rotation axis RX2. The plurality of second wing parts WP2 may be coupled to the second support SP2. For example, the second support SP2 and the plurality of second wing parts WP2 may be coupled by at least one screw SW.

The first support SP1 may be coupled to the plate PL. The first support SP1 may also be coupled to the hinge HG. The first support SP1 may support the first non-folding area NFA1 of the display panel DP. When viewed in a plane, the first support SP1 may overlap the first non-folding area NFA1 of the display panel DP. The first support SP1 may rotate about the first rotation axis RX1 with respect to the hinge HG.

The second support SP2 may be coupled to the plate PL. The second support SP2 may also be coupled to the hinge HG. The second support SP2 may be spaced apart from the first support SP1 in the first direction DR1 with the hinge HG therebetween. The second support SP2 may support the second non-folding area NFA2 of the display panel DP. When viewed in a plane, the second support SP2 may overlap the second non-folding area NFA2 of the display panel DP. The second support SP2 may rotate about the second rotation axis RX2 with respect to the hinge HG.

The first shaft SF1 may be coupled to the first support SP1 and extend in the second direction DR2. The second shaft SF2 may be coupled to the second support SP2 and extend in the second direction DR2.

The first sub support SS1 may be disposed between the first support SP1 and the body part BD. A first through-hole HL1 extending in the second direction DR2 may be defined in the first sub support SS1. The first shaft SF1 may be disposed to pass through the first through-hole HL1. The first sub support SS1 may be rotatably coupled to the first shaft SF1. The first sub support SS1 may contact the plate PL. The first sub support SS1 may support the first bending area BA1 of the display panel DP. When viewed in a plane, the first sub support SS1 may overlap the first bending area BA1 of the display panel DP.

The second sub support SS2 may be disposed between the second support SP2 and the body part BD. A second through-hole HL2 extending in the second direction DR2 may be defined in the second sub support SS2. The second shaft SF2 may be disposed to pass through the second through-hole HL2. The second sub support SS2 may be rotatably coupled to the second shaft SF2. The second sub support SS2 may contact the plate PL. The second sub support SS2 may support the second bending area BA2 of the display panel DP. When viewed in a plane, the second sub support SS2 may overlap the second bending area BA2 of the display panel DP.

The first guide GD1 may be disposed under the first sub support SS1. The first guide GD1 may be accommodated in a first accommodation groove HM1 defined in the first support SP1. When viewed in a plane, the first guide GD1 may protrude from the first sub support SS1 in the second direction DR2.

The second guide GD2 may be disposed under the second sub support SS2. The second guide GD2 may be accommodated in a second accommodation groove HM2 defined in the second support SP2. When viewed in a plane, the second guide GD2 may protrude from the second sub support SS2 in the second direction DR2.

Figure 5A:
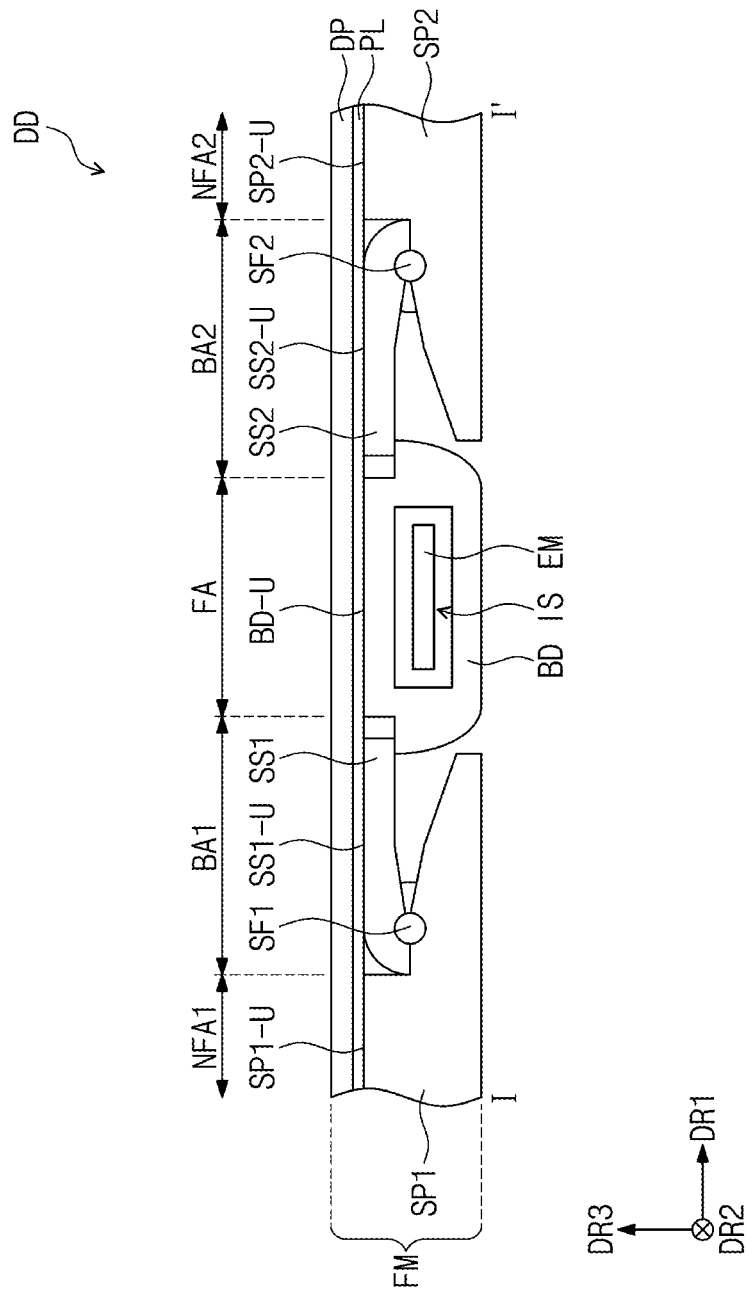
FIG. 5A is a cross-sectional view taken along line I-I' of FIG. 3 according to an embodiment.

FIG. 5A is a cross-sectional view taken along line I-I' of FIG. 3 according to an embodiment.

Referring to FIG. 5A, in the unfolded display device DD, the display panel DP and the plate PL may be supported by the folding module FM.

A top surface BD-U of the body part BD may support the folding area FA of the display panel DP. A top surface SS1-U of the first sub support SS1 may support the first bending area BA1 of the display panel DP. A top surface SS2-U of the second sub support SS2 may support the second bending area BA2 of the display panel DP. A top surface SP1-U of the first support SP1 may support the first non-folding area NFA1 of the display panel DP. A top surface SP2-U of the second support SP2 may support the second non-folding area NFA2 of the display panel DP.

The top surface BD-U of the body part BD, the top surface SS1-U of the first sub support SS1, the top surface SS2-U of the second sub support SS2, the top surface SP1-U of the first support SP1, and the top surface SP2-U of the second support SP2 may provide a flat surface. The plate PL may contact the flat surface.

The plate PL may have a continuous shape. The plate PL may be continuously disposed below the first non-folding area NFA1, the second non-folding area NFA2, the folding area FA, the first bending area BA1, and the second bending area BA2 of the display panel DP.

According to an embodiment, the folding module FM may support the display panel DP and the plate PL. The folding module FM may improve the flatness of the display panel DP and the plate PL. The body part BD may prevent the folding area FA of the display panel DP from drooping downward. The downward dropping phenomenon may refer to a phenomenon in which the folding area FA droops downward due to stress applied to the folding area FA of the display panel DP upon repetitive folding or unfolding of the display panel DP. The folding area FA of the display panel DP may be supported by the body part BD to maintain the flatness. Thus, in the unfolded state, the shape of the folding area FA of the display panel DP may be suppressed from being deformed.

An inner space IS may be defined in the body part BD. The electronic module EM may be disposed in the inner space IS. For example, the electronic module EM may include a camera module. However, the inventive concepts are not limited to particular components disposed in the inner space IS. For example, in some embodiments, components for facilitating the folding of the hinge HG may be disposed in the inner space IS.

Figure 5B:
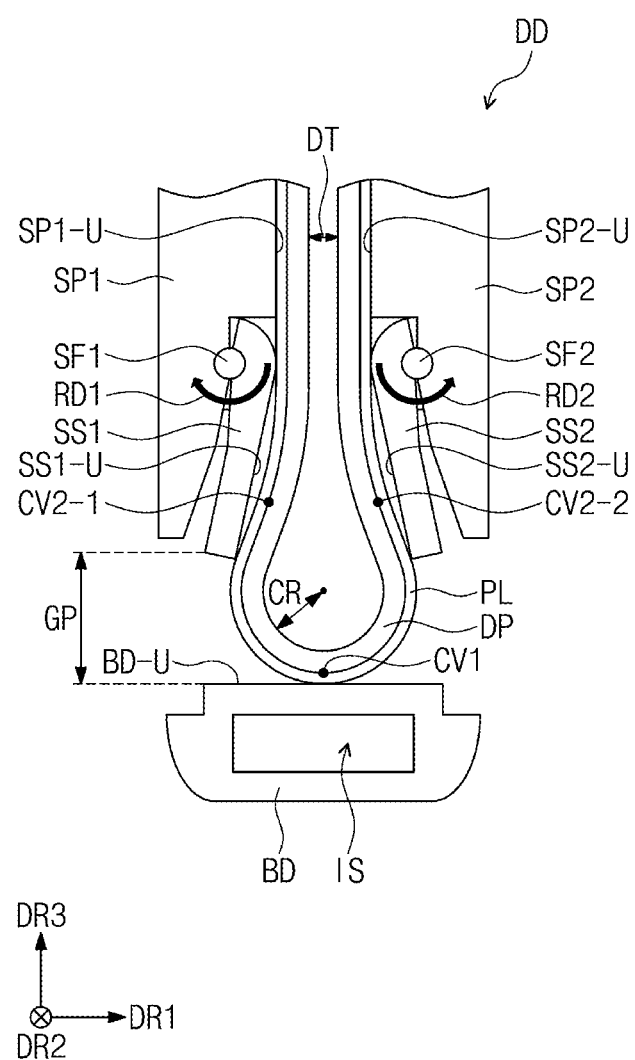
FIG. 5B is a cross-sectional view of the folded display device according to an embodiment.

FIG. 5B is a cross-sectional view of the folded display device according to an embodiment.

Referring to FIG. 5B, in the folded display device DD, the display panel DP and the plate PL may be supported by the folding module FM (see FIG. 4).

A distance DT between the first non-folding area NFA1 (see FIG. 5A) and the second non-folding area NFA2 (see FIG. 5A) of the display panel DP may be less than twice a radius of curvature CR of the folding area FA (see also FIG. 5A).

When the display device DD is folded, the first sub support SS1 may rotate about the first shaft SF1 in a direction RD1 toward the first support SP1. The second sub support SS2 may rotate about the second shaft SF2 in a direction RD2 toward the second support SP2. The first sub support SS1 and the second sub support SS2 may provide a space in which each of the first bending area BA1 (see FIG. 5A), the second bending area BA2 (see FIG. 5A), and the folding area FA (see FIG. 5A) is bendable at a predetermined curvature.

A first point CV1 of the bottom surface of the folding area FA (see FIG. 5A) may have a first curvature. A second point CV2-1 of the bottom surface of the first bending area BA1 (see FIG. 5A) may have a second curvature less than the first curvature in an opposite direction of the first curvature. A third point CV2-2 of the bottom surface of the second bending area BA2 (see FIG. 5A) may have a third curvature less than the first curvature in the opposite direction. A shape of the first bending area BA1 (see FIG. 5A) having the second curvature and a shape of the second bending area BA2 (see FIG. 5A) having the third curvature may be symmetrical to each other with respect to an axis extending in the third direction DR3.

A first curvature center of the first curvature may be spaced apart from the plate PL toward the display panel DP with respect to the first point CV1. A second curvature center of the second curvature may be spaced apart from the display panel DP toward the plate PL with respect to the second point CV2-1. A third curvature center of the third curvature may be spaced apart from the display panel DP toward the plate PL with respect to the third point CV2-2.

The first curvature center may be closer to the top surface of the display panel DP than the bottom surface of the display panel DP, and the second curvature center and the third curvature center may be closer to the bottom surface of the display panel DP than the top surface of the display panel DP.

A top surface of a first area of the plate PL overlapping the first bending area BA1 (see FIG. 5A) may provide first force in a direction toward the display panel DP. The first area may have the second curvature in a direction toward the display panel DP by the first force. A top surface of a second area of the plate PL overlapping the second bending area BA2 (see FIG. 5A) may provide second force in a direction toward the display panel DP. The second area may have the third curvature in a direction toward the display panel DP by the second force.

Each of the first area and the second area of the plate PL may provide force toward the display panel DP. For example, the second curvature of the first bending area BA1 (see FIG. 5A) and the third curvature of the second bending area BA2 (see FIG. 5A) may be increased. In this case, first tensile force may be provided to the first bending area BA1 (see FIG. 5A) by the second curvature, and second tensile force may be provided to the second bending area BA2 (see FIG. 5A) by the third curvature. In this manner, the first tensile force and the second tensile force may alleviate tensile force applied to the folding area FA (see FIG. 5A) by the first curvature defined in the folding area FA (see FIG. 5A). Accordingly, stress applied to the folding area FA (see FIG. 5A) in the folded state may be reduced.

When the display panel DP is folded, the top surface BD-U of the body part BD may support a portion of the folding area FA (see FIG. 5A) of the display panel DP. The body part BD may contact the plate PL. The top surface SS1-U of the first sub support SS1 may support a portion of the first bending area BA1 of the display panel DP. The top surface SS2-U of the second sub support SS2 may support a portion of the second bending area BA2 of the display panel DP. The top surface SP1-U of the first support SP1 may support the first non-folding area NFA1 of the display panel DP. The top surface SP2-U of the second support SP2 may support the second non-folding area NFA2 of the display panel DP.

The first sub support SS1 may rotate about the first shaft SF1 in a direction toward the first support SP1 while the display panel DP and the plate PL are folded. The second sub support unit SS2 may rotate about the second shaft SF2 in a direction toward the second support unit SP2 while the display panel DP and the plate PL are folded.

The first sub support SS1 and the second sub support SS2 may be spaced apart from the body part BD by a first gap GP in the third direction DR3.

According to an embodiment, when an impact is applied to the display device DD from the outside, the body part BD may be spaced apart from the first sub support SS1, the second sub support SS2, the first support SP1, and the second support SP2 by the first gap GP to prevent collision therebetween. Accordingly, the folding module FM (see FIG. 5A) may be prevented or at least be suppressed from being deformed. Therefore, durability of the display device DD against the external impact may be improved. The deformation may include damage to the folding module FM (see FIG. 5A), deformation in shape of each of the elements constituting the folding module FM (see FIG. 5A), or deformation by which the folding module FM (see FIG. 5A) becomes unfoldable.

Figure 6A:
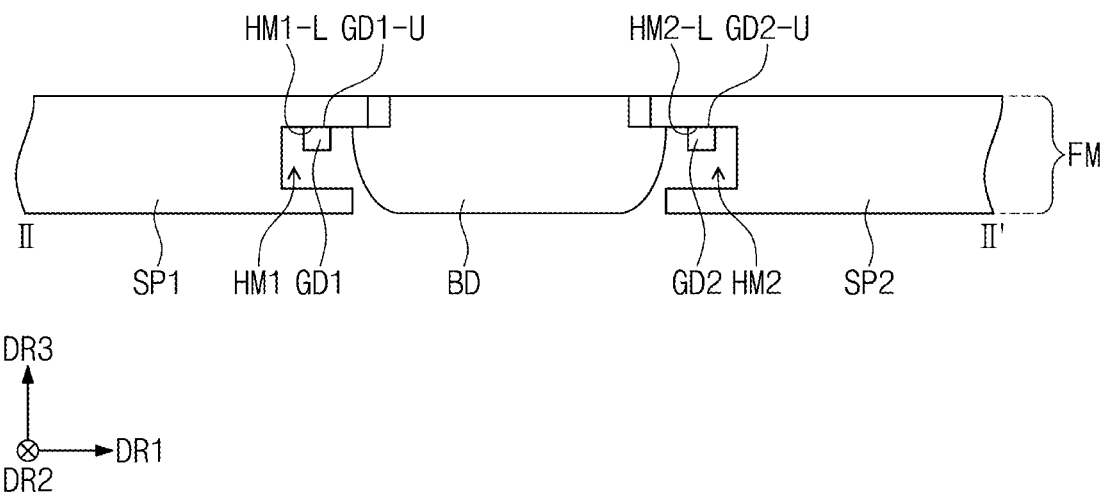
FIG. 6A is a cross-sectional view taken along line II-II' of FIG. 3 according to an embodiment.
Figure 6B:
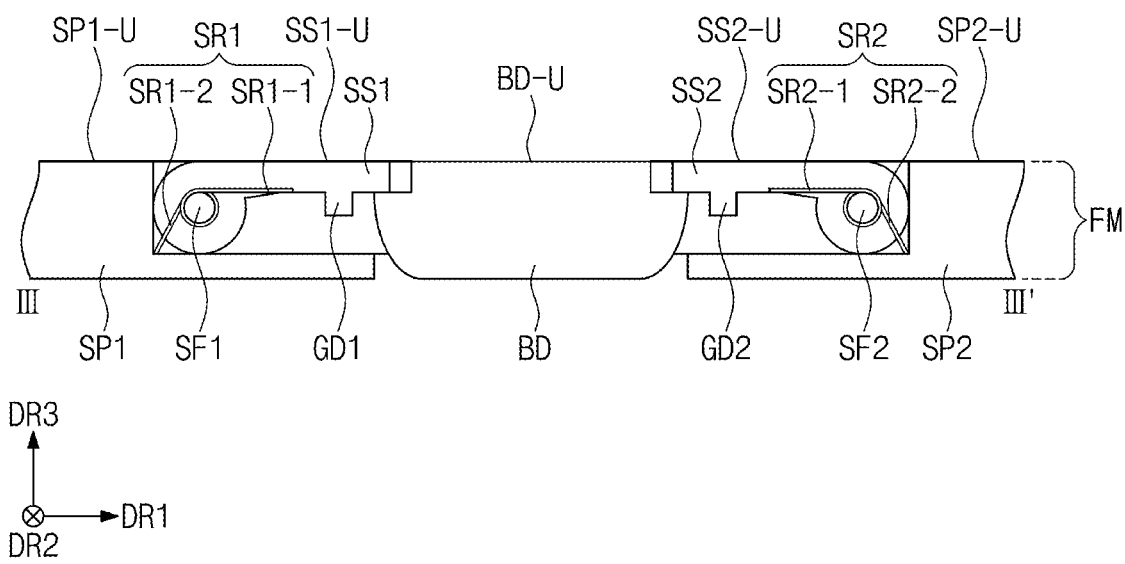
FIG. 6B is a cross-sectional view taken along line of FIG. 3 according to an embodiment.

FIG. 6A is a cross-sectional view taken along line of FIG. 3 according to an embodiment, and FIG. 6B is a cross-sectional view taken along line of FIG. 3 according to an embodiment.

Referring to 6A and 6B, the first guide GD1 may be disposed under the first sub support SS1. The first guide GD1 and the first sub support SS1 may be integrated with each other. The first guide GD1 may be accommodated in the first accommodation groove HM1 defined in the first support SP1. The top surface GD1-U of the first guide portion GD1 may contact the bottom surface HM1-L defining the first accommodation groove HM1. The bottom surface HM1-L defining the first accommodation groove HM1 may prevent the first sub support SS1 from protruding in the third direction DR3.

The second guide GD2 may be disposed under the second sub support SS2. The second guide GD2 and the second sub support SS2 may be integrated with each other. The second guide GD2 may be accommodated in the second accommodation groove HM2 defined in the second support SP2. The top surface GD2-U of the second guide portion GD2 may contact the bottom surface HM2-L defining the second accommodation groove HM2. The bottom surface HM2-L defining the second accommodation groove HM2 may prevent the second sub support SS2 from protruding in the third direction DR3.

According to an embodiment, the first sub support SS1 and the first support SP1 may provide a flat surface on the bottom surface of the plate PL by the first guide GD1. The second sub support SS2 and the second support SP2 may provide a flat surface on the bottom surface of the plate PL by the second guide portion GD2. The display panel DP may be supported by the first sub support SS1, the first support SP1, the second sub support SS2, and the second support SP2 to maintain the flatness. Thus, in the unfolded state, the flatness of the display panel DP may be improved.

The folding module FM may include a first spring SR1 and a second spring SR2. The first spring SR1 may be disposed to pass through the first shaft SF1. The first spring SR1 may include a first portion SR1-1 and a second portion SR1-2. The first portion SR1-1 may be coupled to the first sub support SS1. The second part SR1-2 may be coupled to the first support SP1. The first spring SR1 may have elastic force in the third direction DR3. For example, the first spring SR1 may provide elastic force to the first sub support SS1 in the direction toward the display panel DP.

The second spring SR2 may be disposed to pass through the second shaft SF2. The second spring SR2 may include a first portion SR2-1 and a second portion SR2-2. The first portion SR2-1 may be coupled to the second sub support SS2. The second portion SR2-2 may be coupled to the second support SP2. The second spring SR2 may have elastic force in the third direction DR3. For example, the second spring SR2 may provide elastic force to the second sub support SS2 in the direction toward the display panel DP.

The first spring SR1 may allow the top surface SS1-U of the first sub support SS1 to contact the plate PL. The first sub support SS1 may support the display panel DP and the plate PL. The second spring SR2 may allow the top surface SS2-U of the second sub support SS2 to contact the plate PL. The second sub support unit SS2 may support the display panel DP and the plate PL. The top surface BD-U of the body part BD, the top surface SS1-U of the first sub support SS1, the top surface SS2-U of the second sub support SS2, the top surface SP1-U of the first support SP1, and the top surface SP2-U of the second support SP2 may provide a flat surface. Thus, in the unfolded state, the flatness of the display panel DP may be improved.

Figure 7:
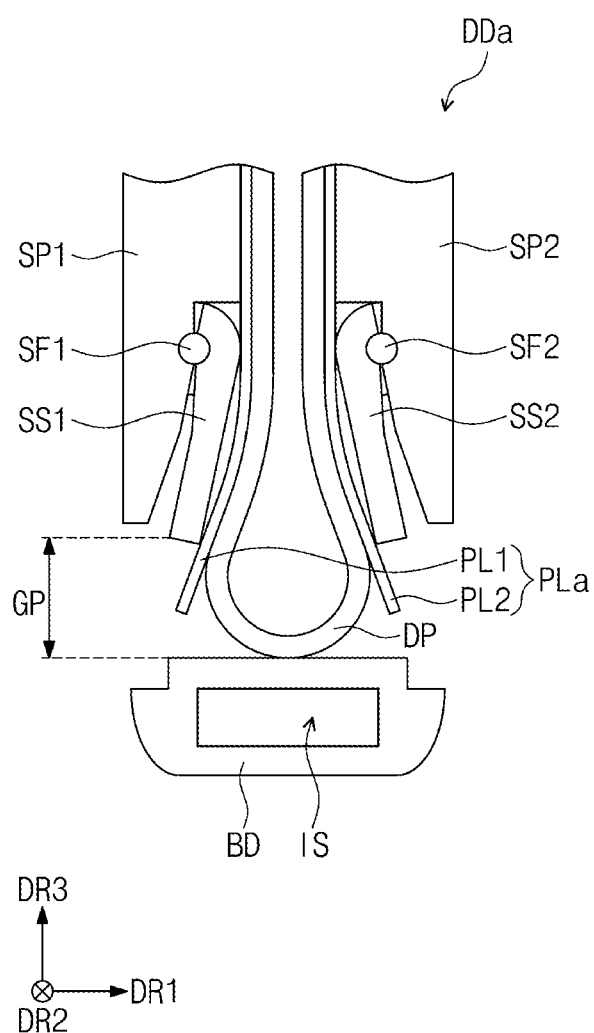
FIG. 7 is a cross-sectional view of a folded display device according to an embodiment.

FIG. 7 is a cross-sectional view of the folded display device according to an embodiment. In descriptions of FIG. 7, the components that are substantially the same as those described above with reference to FIG. 5B will be given the same reference numerals, and thus, repeated descriptions thereof will be omitted.

Referring to FIG. 7, a display device DDa may be folded. A plate PLa may be disposed under the display panel DP. The plate PLa may support the display panel DP. The plate PLa may include a first plate PL1 and a second plate PL2. The first plate PL1 may overlap the first bending area BA1 (see FIG. 5A) and the first non-folding area (NFA1, see FIG. 5A). The second plate PL2 may overlap the second bending area BA2 (see FIG. 5A) and the second non-folding area NFA2 (see FIG. 5A). The folding area FA of the display panel DP (see FIG. 5A) may not overlap the plate PLa. The display panel DP may contact the body part BD.

The bottom surface of the folding area FA (see FIG. 5A) may have a first curvature. The bottom surface of the first bending area BA1 (see FIG. 5A) may have a second curvature less than the first curvature in a direction opposite to the first curvature. The bottom surface of the second bending area BA2 (see FIG. 5A) may have a third curvature less than the first curvature in the opposite direction. A shape of the first bending area BA1 (see FIG. 5A) having the second curvature and a shape of the second bending area BA2 (see FIG. 5A) having the third curvature may be symmetrical to each other with respect to an axis extending in the third direction DR3.

A first curvature center of the first curvature may be closer to the top surface of the display panel DP than the bottom surface of the display panel DP, and the second curvature center of the second curvature and the third curvature center of the third curvature may be closer to the bottom surface of the display panel DP than the top surface of the display panel DP.

The first plate PL1 may provide first force in the direction toward the display panel DP. The top surface of the first plate PL1 may have the second curvature in the direction toward the display panel DP by the first force. The second plate PL2 may provide second force in the direction toward the display panel DP. The top surface of the second plate PL2 may have a third curvature in the direction toward the display panel DP by the second force.

Each of the first plate PL1 and the second plate PL2 may provide force toward the display panel DP. For example, the second curvature of the first bending area BA1 (see FIG. 1A) and the third curvature of the second bending area BA2 (see FIG. 1A) may be increased. In this case, first tensile force may be provided to the first bending area BA1 (see FIG. 5A) by the second curvature, and second tensile force may be provided to the second bending area BA2 (see FIG. 5A) by the third curvature. In this manner, the first tensile force and the second tensile force may alleviate tensile force applied to the folding area FA (see FIG. 5A) by the first curvature defined in the folding area FA (see FIG. 5A). Accordingly, stress applied to the folding area FA (see FIG. 5A) in the folded state may be reduced.

Figure 8:
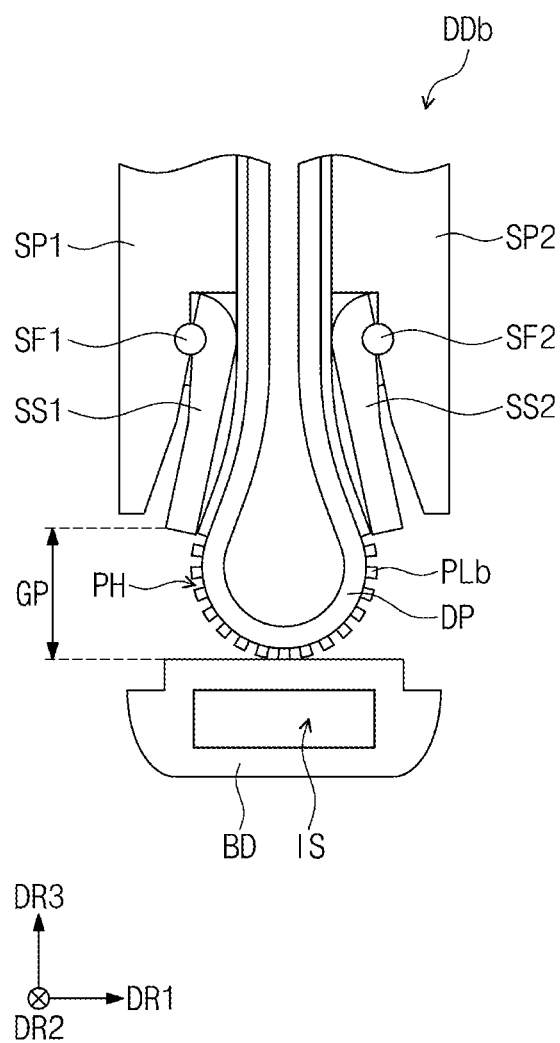
FIG. 8 is a cross-sectional view of a folded display device according to an embodiment.

FIG. 8 is a cross-sectional view of the folded display device according to an embodiment. In descriptions of FIG. 8, the components that are substantially the same as those described above with reference to FIG. 5B will be given the same reference numerals, and thus, repeated descriptions thereof will be omitted.

Referring to FIG. 8, a display device DDb may be folded. The plate PLb may be disposed under the display panel DP. The plate PLb may be disposed below the first non-folding area NFA1 (see FIG. 5A), the second non-folding area NFA2 (see FIG. 5A), the folding area FA (see FIG. 5A), the first bending area BA1 (FIG. 5A), and the second banding area BA2 (see FIG. 5A). The plate PLb may have a continuous shape. The plate PLb may support the display panel DP. A plurality of grooves PH may be defined in a portion of the plate PLb that overlaps at least the folding area FA of the display panel DP (see FIG. 5A).

According to the illustrated embodiment, the plurality of grooves PH may reduce repulsive force generated when the display panel DP is bent. Accordingly, folding of the folding area FA (see FIG. 5A) of the display panel DP in the display device DDb may be facilitated by the plurality of grooves PH.

Figure 9:
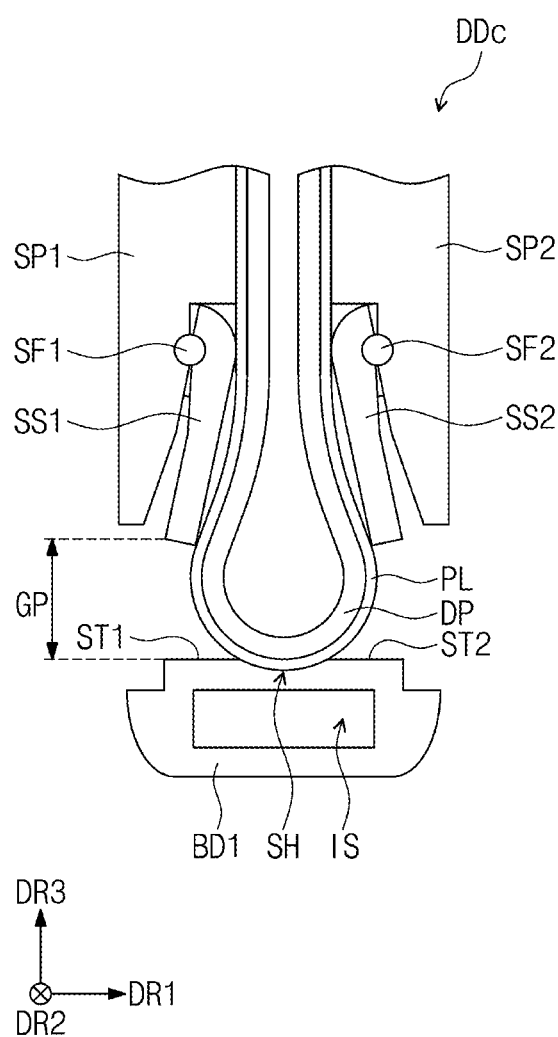
FIG. 9 is a cross-sectional view of a folded display device according to an embodiment.

FIG. 9 is a cross-sectional view of a folded display device according to an embodiment exemplary. In descriptions of FIG. 9, the components that are substantially the same as those described above with reference to FIG. 5B will be given the same reference numerals, and thus, repeated descriptions thereof will be omitted.

Referring to FIG. 9, a display device DDc may be folded. A body part BD1 may be disposed under the display panel DP and the plate PL. A first plane ST1, a support groove SH, and a second plane ST2 may be defined on the top surface of the body part BD1. The second plane ST2 may be spaced apart from the first plane ST1 in the first direction DR1. The support groove SH may be disposed between the first plane ST1 and the second plane ST2. The support groove SH may be defined by being concavely recessed between the first plane ST1 and the second plane ST2.

A curvature of the support groove SH may correspond to the curvature of the bottom surface of the plate PL.

According to the illustrated embodiment, a curvature radius of the folding area FA (see FIG. 5A) of the display panel DP may be controlled by the support groove SH of the body part BD1. The display panel DP may be bent along a shape of the support groove SH. The body part BD1 may guide the display panel DP and the plate PL so that the display panel DP is folded at a curvature at which the deformation in shape of the folding area FA (See FIG. 5A) of the display panel DP is minimized.

Figure 10A:
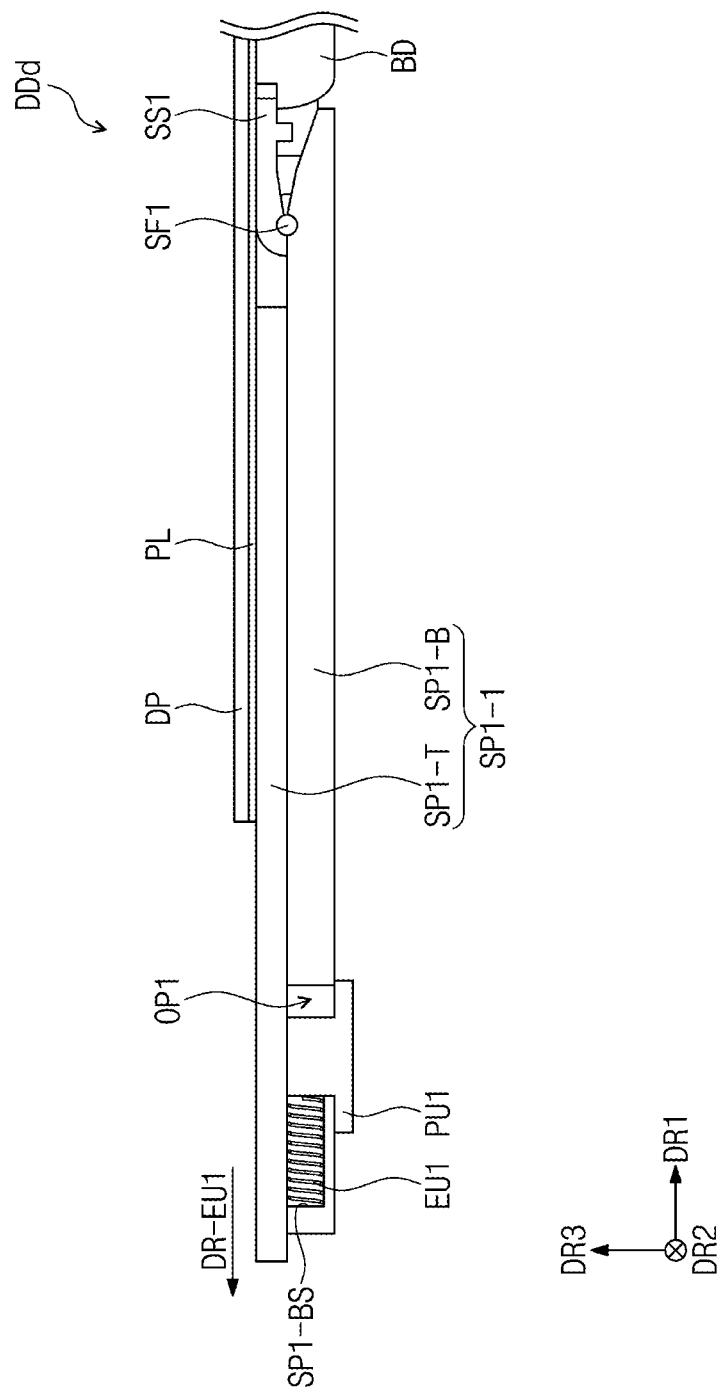
FIG. 10A is a cross-sectional view of a display device according to an embodiment.
Figure 10B:
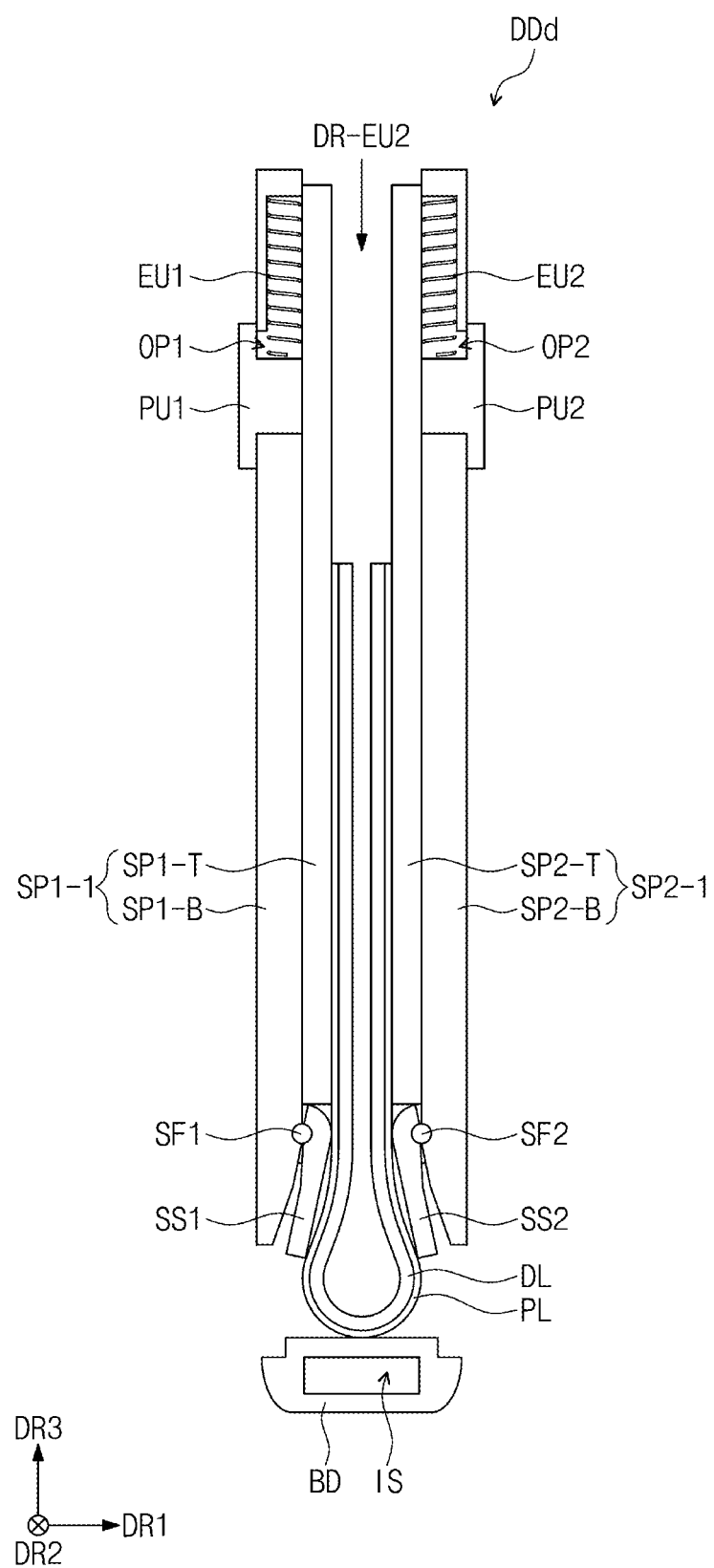
FIG. 10B is a cross-sectional view illustrating a folded state of the display device of FIG. 10A according to an embodiment.

FIG. 10A is a cross-sectional view of a display device according to an embodiment, and FIG. 10B is a cross-sectional view illustrating a state in which the display device of FIG. 10A is folded according to an embodiment. In descriptions of FIGS. 10A and 10B, the components that are substantially the same as those described above with reference to FIGS. 5A and 5B will be given the same reference numerals, and thus, repeated descriptions thereof will be omitted.

Referring to FIGS. 10A and 10B, a first support SP1-1 may include a first upper support SP1-T, a first lower support SP1-B, a first protrusion PU1, and a first elastic part EU1.

The first upper support SP1-T may be disposed on the first lower support SP1-B. The first upper support SP1-T may be slidably coupled to the first lower support SP1-B. The display panel DP and the plate PL may be disposed on the first upper support SP1-T.

A first opening OP1 may be defined in the first lower support SP1-B.

The first protrusion PU1 may be disposed in the first opening OP1. The first protrusion PU1 may protrude from the first upper support SP1-T in the third direction DR3. The first protrusion PU1 and the first upper support SP1-T may be integrated with each other.

The first elastic part EU1 may be disposed in the first opening OP1. The first elastic part EU1 may be disposed between a sidewall SP1-BS of the first lower support SP1-B and the first protrusion PU1. The first elastic part EU1 may have one side coupled to the sidewall SP1-BS of the first lower support SP1-B. The first elastic portion EU1 may have the other side coupled to one side of the first protrusion PU1. The first elastic part EU1 may provide elastic force to the first upper support SP1-T and the first lower support SP1-B.

When the display device DDd is unfolded, the first elastic part EU1 may provide force in a first elastic direction DR-EU1. The first elastic direction DR-EU1 may be parallel to the first direction DR1. In this manner, the first protrusion PU1 may be shifted in the first elastic direction DR-EU1. The first upper support SP1-T may be coupled to the first protrusion PU1 so as to be slid in the first elastic direction DR-EU1.

According to the illustrated embodiment, the first elastic part EU1 may provide force to the first upper support SP1-T in the first elastic direction DR-EU1. In this manner, the first upper support SP1-T may be shifted in a direction away from the body part BD. Force may be provided to the folding area FA (see FIG. 5A) of the display panel DP coupled to the first upper support SP1-T in the first elastic direction DR-EU1. When the display device DDd is unfolded, force may be applied to the display panel DP in directions away from each other by the first elastic part EU1 and the second elastic part EU2. As such, a downward drooping phenomenon of the folding area FA of the display panel DP (see FIG. 5A) may be improved. Thus, in the unfolded state, the shape of the folding area FA (see FIG. 5A) of the display panel DP may be prevented or at least be suppressed from being deformed.

The first support SP1-1 and the second support SP2-1 disposed to be spaced apart from each other in the first direction DR1 may be provided in a shape that is symmetrical to the first support SP1-1.

When the display device DDd is folded, the first elastic EU1 and the second elastic EU2 may provide force in a second elastic direction DR-EU2. The second elastic direction DR-EU2 may be parallel to the third direction DR3. In this manner, the first protrusion PU1 and the second protrusion PU2 may be shifted in the second elastic direction DR-EU2. The first upper support SP1-T may be coupled to the first protrusion PU1 so as to be slid in the second elastic direction DR-EU2. The second upper support SP2-T may be coupled to the second protrusion PU2 so as to be slid in the second elastic direction DR-EU2.

According to the illustrated embodiment, the first elastic part EU1 may provide force to the first upper support SP1-T in the second elastic direction DR-EU2, and the second elastic part EU2 may provide force to the second upper support SP2-1 in the second elastic direction DR-EU2. When the display device DDd is folded, force may be applied to the display panel DP by the first elastic part EU1 and the second elastic part EU2 in directions that are closer to the body part BD. As such, the tensile force applied to the folding area FA of the display panel DP (see FIG. 5A) may be alleviated. Therefore, in the folded state, the stress applied to the folding area FA (see FIG. 5A) may be reduced.

According to the embodiments, the plate disposed below the display panel may support the bottom surface of the display panel that is folded or unfolded. When the display panel is in the unfolded state, the display panel may have improved flatness by the plate. Therefore, in the folded state, the shape of the folding area may be maintained by the plate. In addition, the folding area of the display panel may be supported by the body part. For example, when the display panel is in the unfolded state, the folding area of the display panel may be supported by the body part so maintain its flatness. The body part may prevent the folding area of the display panel from drooping downward. As such, in the unfolded state by the plate and the body part, the deformation in shape of the folding area of the display panel may be reduced.

According to the embodiments, the body part may be spaced apart from each of the first sub support, the second sub support, and the second support by a predetermined gap. Therefore, even though the external impact is applied to the display device, the first sub support and the second sub support may be prevented or at least be suppressed from colliding with the body part, and thus, the possibility that the folding module is deformed may be reduced. Therefore, the durability of the display device against the external impact may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device comprising:
a display panel including a first non-folding area, a second non-folding area spaced apart from the first non-folding area in a first direction, a folding area disposed between the first non-folding area and the second non-folding area, a first bending area disposed between the folding area and the first non-folding area, and a second bending area disposed between the folding area and the second non-folding area;
a plate disposed below the display panel; and
a folding module disposed below the plate to support the display panel,
wherein the folding module comprises:
   a hinge configured to support the folding area and including a body part;
   a first support configured to support the first non-folding area and coupled to the hinge;
   a second support configured to support the second non-folding area and coupled to the hinge;
   a first sub support configured to support the first bending area and rotatably coupled to the first support; and
   a second sub support configured to support the second bending area and rotatably coupled to the second support,
wherein at least a portion of the plate is exposed between the first sub support and the body part when the display device is folded, and
wherein a distance between the body part and the first support is greater than a distance between the body part and the first sub support when the display device is folded.

2. The display device of claim 1, wherein, when the display device is folded, a distance between the first non-folding area of the display panel and the second non-folding area of the display panel is less than twice a curvature radius of the folding area.

3. The display device of claim 1, wherein:
the first sub support and the second sub support contact the plate; and
the first support and the second support are coupled to the plate.

4. The display device of claim 1, wherein the hinge comprises:
a plurality of first wing parts rotatably coupled to the body part; and
a plurality of second wing parts rotatably coupled to the body part, and
wherein:
the body part extends in a second direction crossing the first direction; and
the first wing parts are coupled to the first support, and the second wing parts are coupled to the second support.

5. The display device of claim 4, wherein, when the display device is folded, the first sub support and the second sub support are spaced apart from the body part.

6. The display device of claim 4, further including electronic modules,
wherein the body part has an inner space in which the electronic modules are disposed.

7. The display device of claim 4, wherein, when the display device is folded, the body part contacts the plate.

8. The display device of claim 4, wherein the body part has a top surface including a first plane, a second plane spaced apart from the first plane in the first direction, and a support groove that is concavely recessed between the first plane and the second plane.

9. The display device of claim 1, wherein the folding module further comprises:
a first shaft coupled to the first support to pass through the first sub support; and
a second shaft coupled to the second support to pass through the second sub support.

10. The display device of claim 9, wherein the folding module further comprises:
a first spring disposed to pass through the first shaft and coupled to the first support and the first sub support; and
a second spring disposed to pass through the second shaft and coupled to the second support and the second sub support.

11. The display device of claim 1, wherein the folding module further comprises:
a first guide disposed below the first sub support and a second guide disposed below the second sub support; and
a first accommodation hole formed in the first support to accommodate the first guide, and a second accommodation hole formed in the second support to accommodate the second guide.

12. The display device of claim 11, wherein, when viewed in a plane, the first guide protrudes from the first sub support in a second direction crossing the first direction, and the second guide part protrudes from the second sub support in the second direction.

13. The display device of claim 1, wherein the plate comprises:
a first plate disposed below the first bending area and the first non-folding area; and
a second plate disposed below the second bending area and the second non-folding area and spaced apart from the first plate in the first direction.

14. The display device of claim 1, wherein the plate is disposed below the first non-folding area, the second non-folding area, the folding area, the first bending area, and the second bending area and has a continuous shape.

15. The display device of claim 1, wherein, when viewed in a plane, the plate includes a plurality of grooves defined in a portion thereof that overlaps at least the folding area of the display panel.

16. The display device of claim 1, wherein, when the display device is folded, the folding area has a first curvature, and each of the first bending area and the second bending area has a second curvature less than the first curvature in an opposite direction of the first curvature.

17. The display device of claim 1, wherein the first support comprises;
a first lower support in which a first opening is defined;
a first upper support disposed on the first lower support and slidably coupled to the first lower support; and
a first elastic part disposed in the first opening.

18. A display device comprising:
a foldable or unfoldable display panel;
a plate disposed below the display panel;
a hinge disposed below the plate and including a body part;
a first support disposed below the plate and coupled to one side of the hinge;
a second support disposed below the plate and coupled to the other side of the hinge;
a first sub support disposed between the first support and the hinge; and
a second sub support disposed between the second support and the hinge,
wherein, when the display panel is unfolded, a top surface of the hinge, a top surface of the first support, a top surface of the second support, a top surface of the first sub support, and a top surface of the second sub support provide a flat surface along a first direction, wherein at least a portion of the plate is exposed between the first sub support and the body part when the display device is folded, and wherein a distance between the body part and the first support is greater than a distance between the body part and the first sub support when the display device is folded.

19. The display device of claim 18, wherein:

the plate is coupled to the first support and the second support; and the plate contacts the hinge, the first sub support, and the second sub support.

20. The display device of claim 18, wherein, when the display panel is folded, the hinge is spaced apart from the first sub support and the second sub support.

* * * * *